(12) United States Patent
Park et al.

(10) Patent No.: US 9,559,735 B2
(45) Date of Patent: Jan. 31, 2017

(54) SWITCHING RESONATOR FILTER CIRCUITS AND METHODS

(71) Applicant: QUALCOMM Incorporated, San Diego, CA (US)

(72) Inventors: Jungdong Park, San Jose, CA (US); Hong Sun Kim, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/610,888

(22) Filed: Jan. 30, 2015

(65) Prior Publication Data

US 2016/0226536 A1    Aug. 4, 2016

(51) Int. Cl.

| H04B 1/10 | (2006.01) |
| H03H 7/01 | (2006.01) |
| H03F 3/19 | (2006.01) |
| H04B 1/16 | (2006.01) |
| H03H 7/075 | (2006.01) |

(52) U.S. Cl.
CPC .............. H04B 1/1081 (2013.01); H03F 3/19 (2013.01); H03H 7/0153 (2013.01); H04B 1/16 (2013.01); *H03F 2200/294* (2013.01); *H03F 2200/451* (2013.01); *H03H 7/075* (2013.01)

(58) Field of Classification Search
CPC .. H01L 23/5223; H01L 23/5227; H01L 28/10; H01L 28/40; H03F 2200/294; H03F 2200/451; H03F 3/195; H03F 1/3205; H03F 1/34; H03F 1/565; H03F 2200/111; H03F 2200/138; H03F 2200/165; H03F 2200/168; H03F 2200/171; H03F 2200/246; H03F 2200/255; H03F 2200/495; H03F 2200/501; H04B 1/18; H04B 1/10; H04B 1/0025; H04B 1/0057; H04B 1/16; H04B 1/28; H04B 1/3833; H04B 1/44; H04B 1/48; H04B 2203/5416; H04B 2203/545; H04B 2203/5454; H04B 3/54; H04B 7/12
See application file for complete search history.

(56) References Cited

U.S. PATENT DOCUMENTS

| 4,980,665 | A | * | 12/1990 | Schotz | H04B 3/54 340/12.33 |
| 6,061,551 | A | * | 5/2000 | Sorrells | H03C 1/62 455/118 |
| 7,587,010 | B2 | | 9/2009 | Morie et al. | |
| 8,063,718 | B2 | | 11/2011 | Ueda et al. | |
| 8,847,676 | B2 | | 9/2014 | Jalaleddine | |

(Continued)

OTHER PUBLICATIONS

Darvishi M., et al., "Widely Tunable 4th Order Switched Gm-C Band-pass Filter Based on N-path Filters," IEEE, 2012, 15 Pages.

(Continued)

*Primary Examiner* — Golam Sorowar
(74) *Attorney, Agent, or Firm* — Haynes and Boone, LLP

(57) ABSTRACT

The present disclosure includes switching resonant filter circuits and methods. In one embodiment, a circuit includes a plurality of resonant switching circuits arranged in a three (3) or four (4) element PI network. In one embodiment, an undesired signal frequency is applied to two resonant switching circuits and a carrier frequency of an RF signal is applied to the other two resonant switching networks so that the network attenuates the undesired signal frequency and passes the carrier frequency. In another embodiment, the resonant switching circuits are configurable to shift a peak impedance so that undesired signals may be attenuated.

17 Claims, 6 Drawing Sheets

(56) References Cited

U.S. PATENT DOCUMENTS

| | | | |
|---|---|---|---|
| 2004/0053590 A1 | 3/2004 | Marholev | |
| 2005/0212612 A1 | 9/2005 | Kawakubo et al. | |
| 2011/0039511 A1* | 2/2011 | Rajendran | H04B 1/18 455/326 |
| 2014/0106698 A1 | 4/2014 | Mi et al. | |
| 2014/0285286 A1* | 9/2014 | Bojer | H03H 7/0153 333/174 |

OTHER PUBLICATIONS

Hasan M.N., et al., "Reconfigurable N-Path RF Front-end Filter with Improved Blocker Rejection," IEEE 57th International Midwest Symposium on Circuits and Systems (MWSCAS), Aug. 2014, pp. 69-72.

Klumperink E., "Multi-Path Poly-Phase Passive Mixer Circuits for Flexibly Programmable Harmonic Rejection Mixing and High-Q Filtering," Jun. 2012, Slide 1-Slide 63.

Mohammadpour A., et al., "An N-Path Enhanced-Q Tunable Filter With Reduced Harmonic Fold Back Effects," IEEE Transactions on Circuits and Systems—I: Regular Papers, 2013, vol. 60 (11), pp. 2867-2877.

Franks L.E., et al., "An Alternative Approach to the Realization of Network Transfer Functions: The N-Path Filter," The Bell System Technical Journal, Sep. 1960, pp. 1321-1350.

Ghaffari A., et al., "Tunable High-Q N-Path Band-Pass Filters: Modeling and Verification," IEEE Journal of Solid-State Circuits, May 2011, vol. 46, No. 5, pp. 998-1010.

International Search Report and Written Opinion—PCT/US2015/067854—ISA/EPO—Apr. 22, 2016.

* cited by examiner

SWITCHING RESONATOR FILTER CIRCUITS AND METHODS

BACKGROUND

The present disclosure relates to electronic systems and methods, and in particular, to switching resonator filter circuits and methods.

Filter circuits are used in a wide range of electronic applications. Filter circuits are typically used as stages in a signal path to allow some frequency components of a signal to pass through the filter while other frequencies are attenuated by the filter. One common example filter is an LRC filter shown in FIG. 1. An LRC filter includes an inductor L, resistor R, and a capacitor C. An LRC filter may be used as a band pass filter, where a range of frequencies within the "pass band" are allowed to pass while frequencies above and below the pass band are attenuated. The pass band is typically centered around a "center frequency," which in the case of an LRC circuit is $\omega o = 1/\text{sqrt}(LC)$. In practical implementations, edges of the pass band are set according to frequencies above and below the center frequency where the attenuation increases to 3 dB.

Filters are often characterized in terms of "quality factor" or "Q". Quality factor describes a resonators bandwidth relative to the center frequency (e.g., $Q = fo/\Delta f$, where fo is the center frequency in Hertz and $\Delta f$ is the width of the pass band (or bandwidth) of the filter. For the parallel LRC filter in FIG. 1, for example, the quality factor is $Q = R*\text{sqrt}(C/L)$. In this case, increasing R increases Q. However, in practical applications achieving high Q using passive components, such as resistors, would result in large circuit areas, high losses, and reduced circuit efficiency. High quality factor circuits are desirable to pass desired frequency components while attenuating other unwanted frequency components that may be close in frequency to the desired frequency components. It would be advantageous to achieve alternatives to typical L, R, and C filtering with very high quality factor filters.

SUMMARY

The present disclosure includes switching resonant filter circuits and methods. In one embodiment, a circuit includes a plurality of resonant switching circuits arranged in a three (3) or four (4) element PI network. In one embodiment, an undesired signal frequency is applied to two resonant switching circuits and a carrier frequency of an RF signal is applied to the other two resonant switching networks so that the network attenuates the undesired signal frequency and passes the carrier frequency. In another embodiment, the resonant switching circuits are configurable to shift a peak impedance so that undesired signals may be attenuated.

The following detailed description and accompanying drawings provide a better understanding of the nature and advantages of the present disclosure.

DETAILED DESCRIPTION

The present disclosure pertains to switching resonator filter circuits and methods. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
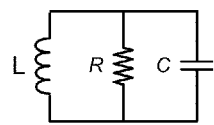
FIG. 1 shows a typical LRC filter.
Figure 2:
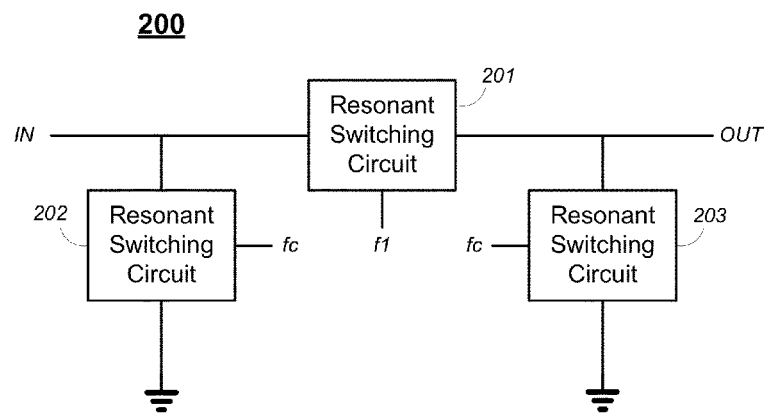
FIG. 2 illustrates a switching resonant filter according to one embodiment.

FIG. 2 illustrates a switching resonant filter according to one embodiment. Features and advantages of the present disclosure include an arrangement of resonant switching circuits to filter an input signal and provide a filtered output signal. Filter 200 includes a first resonant switching circuit 201 having a first terminal coupled to a filter input terminal IN to receive an input signal, a second resonant switching circuit 202 having a first terminal coupled to the filter input terminal IN, and a third resonant switching circuit 203 having a first terminal coupled to a second terminal of the first resonant switching circuit 201. In this example, the second terminal of the first switching resonant circuit 201 is the filter output terminal OUT, and second terminals of the second and third resonant switching circuits 202 and 203 are coupled to ground. The configuration shown in FIG. 2 is sometimes referred to as a three (3) element PI network. Switching resonant circuits described herein may be implemented in various ways. Some resonant switching circuits may be driven by N multiphase clocks with a duty cycle of 1/N, for example, to achieve impedance shifting as described in more detail below and may include capacitors to form multipath switched capacitor circuits as set forth below. In some example embodiments, resonant switching circuits may be M-path circuits as illustrated below.

Figures 3A, 3B:
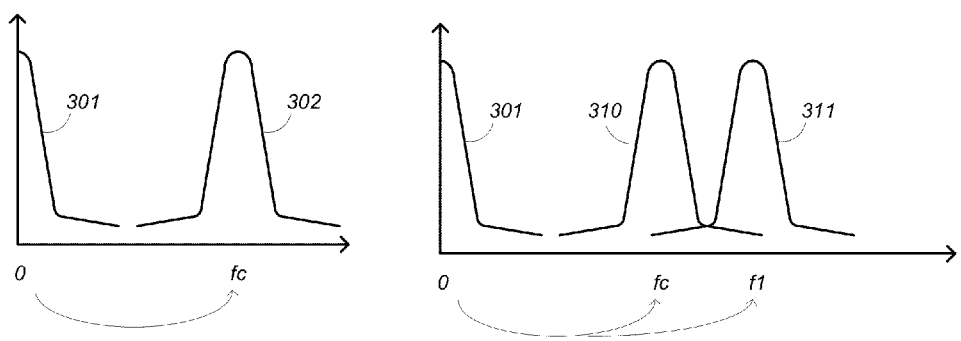
FIG. 3A illustrates an impedance shift in a resonant switching circuit according to an embodiment.
FIG. 3B illustrates impedance shifts in a resonant switching circuit using different frequencies according to an embodiment.

As illustrated in FIG. 2 and as described in more detail below, embodiments of the present disclosure may drive different resonant switching circuits with different frequency signals to achieve impedance shifts that pass desired frequency components and attenuate unwanted frequency components. FIG. 3A illustrates an impedance shift in a resonant switching circuit according to an embodiment. Resonant switching circuits may include frequency selective components, such as capacitors, for example, which may exhibit certain low frequency characteristics. A capacitor, for example, may have a high impedance at zero frequency (e.g., DC open circuit) and the impedance may drop as the frequency increases as shown at 301. Impedance characteristics may be shifted from low frequency at 301 to a higher frequency, fc, at 302 by a resonant switching circuit resulting in the low frequency impedance characteristic shifted to a higher frequency, for example. For a capacitor, the impedance corresponds to $1/j\omega C$. When the impedance is shifted to a higher frequency, fc, the Q becomes $fc/\Delta f$, where fc may be a very high frequency and $\Delta f$ is set by the unshifted 3 dB point (which is very small) at DC, resulting in a very high Q filter, for example.

Example applications of the above impedance shifting are shown in FIG. 2. In FIG. 2, resonant switching circuit 201 may be configured to produce a low impedance at a desired frequency fc and a high impedance at an undesirable frequency f1 by driving resonant circuit 201 at the undesired frequency, f1. Accordingly, a peak in the input impedance of resonant switching circuit 201 is shifted to a frequency f1, where an undesired frequency component at f1 experiences a high impedance and a desired frequency component fc away from f1 experiences a low impedance. FIG. 3B illustrates the input impedance of resonant switching circuit 201 when driven by frequency f1 at 311. At frequency f1, the peak impedance is shifted from DC at 301 to f1 at 311, but at frequency fc, the impedance has dropped.

Likewise, resonant switching circuits 202 and 203 may be configured to produce a high impedance at the desired frequency fc and a low impedance at the undesirable frequency f1 by driving these resonant circuits (202 and 203) at the desired frequency, fc. FIG. 3B illustrates the peak impedance of resonant switching circuits 202 and 203 when driven by frequency fc at 310. In this case, the peak impedance is shifted from DC at 301 to fc at 310, but at frequency f1 the impedance has dropped. Accordingly, because the desired frequency fc experiences a low impedance across resonant switching circuit 201 and a high impedance across resonant switching circuits 202 and 203, the attenuation of the desired frequency components around fc may be maintained low. Conversely, because the undesirable frequency f1 experiences a high impedance across resonant switching circuit 201 and a low impedance across resonant switching circuits 202 and 203, the attenuation of the undesirable frequency component f1 may be high, thereby reducing undesirable spectral content from a signal passed through the filter.

One example application of the above technique is the elimination of jammer signals. In one embodiment, a jammer signal is produced by another circuit (e.g., a local oscillator operating at frequency f1) on the same integrated circuit, and the jammer signal may be provided as an input to resonant switching circuit 201 while the desired signal (another local oscillator operating at frequency fc) is provided to resonant switching circuits 202 and 203. In alternative embodiments described in more detail below, resonant switching circuits may be configurable so that a peak impedance may be shifted above and/or below a particular frequency to eliminate unwanted frequency content.

Figure 4:
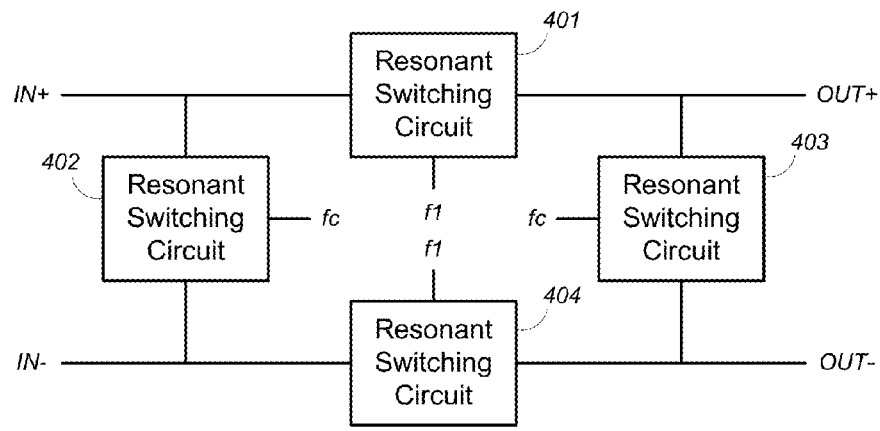
FIG. 4 illustrates a switching resonant filter according to another embodiment.

FIG. 4 illustrates a switching resonant filter according to another embodiment. In this example, the input signal is a differential signal received on input terminals IN+ and IN− and the filter produces a differential output on output terminals OUT+ and OUT−. In this example, resonant switching circuit 401 has a first terminal coupled to IN+ and a second terminal coupled to OUT+, resonant switching circuit 402 has an first terminal coupled to IN+ and the first terminal of circuit 401 and a second terminal coupled to IN−, resonant switching circuit 403 has an first terminal coupled to OUT+ and the second terminal of circuit 401 and a second terminal coupled to OUT−, and resonant switching circuit 404 has an first terminal coupled to IN− and the second terminal of circuit 402 and a second terminal coupled to OUT− and the second terminal of circuit 403. The configuration shown in FIG. 4 is sometimes referred to as a four (4) element PI network. In this example, resonant switching circuits 401 and 404 receive a frequency f1 and resonant switching circuits 402 and 403 receive a frequency of fc so that signal components received on IN+ and IN− having frequency components f1 are attenuated at OUT+ and OUT− and signal components received on IN+ and IN− having frequency components fc are passed to OUT+ and OUT− with less attenuation (or even gain). As illustrated below, alternative embodiments may use the configuration in FIG. 4 with configurable resonant switching circuits to attenuate unwanted frequency content.

Resonant switching circuits arranged as filters as described above may be used in a wide range of applications and realized according to a number of different implementations. The example applications and implementations described below are illustrative, but not limiting, of the full scope of the techniques described herein.

Figure 5:
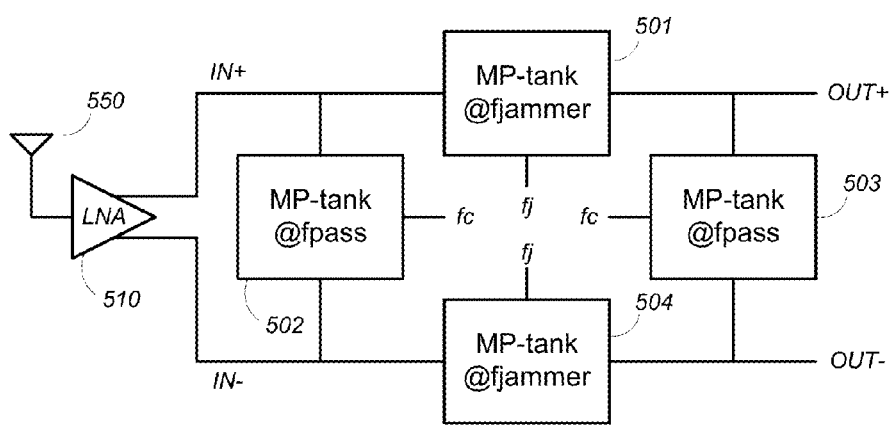
FIG. 5 illustrates an example M-path switching resonant filter according to one embodiment.

FIG. 5 illustrates an example M-path switching resonant filter according to one embodiment. In this example, the resonant switching circuits are M-path tank circuits and the application is wireless communications. A wireless communication channel may include an antenna 550 to receive an RF signal. The RF signal may include information modulated at carrier frequency fc. The RF signal is coupled from the antenna to an input of a low noise amplifier (LNA) 510, which may amplify the RF signal. Actual implementations may include additional circuits between the antenna and LNA, for example. Thus, the present example is merely illustrative. In this example, the output of the LNA is a differential output coupled to filter input terminals IN+ and IN−. In this example, four (4) M-path tank circuits ("MP-tank") are arranged in a four (4) element PI network because LNA has a differential output (e.g., a single ended output LNA may use a three (3) element PI network). M-path filters (sometimes referred to as N-path) are multipath circuits that may use resonant switching to achieve filter characteristics. In this example, a first MP-tank circuit 501 has a terminal coupled to the IN+ output of LNA 510 and a terminal coupled to OUT+. MP-tank 502 has a terminal coupled to IN+ and another terminal coupled to the other output of LNA 510 at IN−. MP-tank 504 has a terminal coupled to IN− and another terminal coupled to OUT−. Finally, MP-tank 503 has a terminal coupled to OUT+ and another terminal coupled to OUT−.

Embodiments of the present disclosure may be used to attenuate undesired signals in the RF signal, for example. An undesired frequency component f1 of the RF signal may be adjacent to the carrier frequency fc. Thus, it is advantageous to have a filter with a high Q to pass the carrier frequency and attenuate the undesired frequency f1. For example, an undesired frequency component f1 may be a jammer signal fj. Jammer signals may have a wide variety of sources, but such signals may be undesirably injected into a received RF signal, for example. For example, a jammer signal having a frequency fj may be generated by a local oscillator on a same integrated circuit substrate as the LNA as mentioned above.

Referring again to FIG. 5, jammer signals having a frequency fj may be attenuated while passing desired portions of an RF signal around the carrier frequency fc by driving MP-tank circuits 501 and 504 at the jammer frequency fj and driving MP-tank circuits 502 and 503 at the carrier frequency of the RF signal fc, for example. Accordingly, MP-tanks 501 and 504 present a high impedance to RF frequency components at the jammer frequency fj and lower impedance to RF frequency components at the carrier frequency fc. Similarly, MP-tanks 502 and 503 present a high impedance to RF frequency components at the carrier frequency fc and lower impedance to RF frequency components at the jammer frequency fj. Therefore, jammer frequency components in the RF signal on IN+ and IN− from the LNA are attenuated and information around the carrier frequency in the RF signal on IN+ and IN− is passed to the output. In one example application, a local oscillator signal used to down convert the RF signal at the carrier frequency is coupled to MP-tanks 502 and 503 and another local oscillator (e.g., on the same integrated circuit) used to down convert signals at frequency f1 is coupled to MP-tanks 501 and 504 to attenuate jammer frequencies at frequency f1 injected into the RF signal by the other local oscillator.

Figure 6:
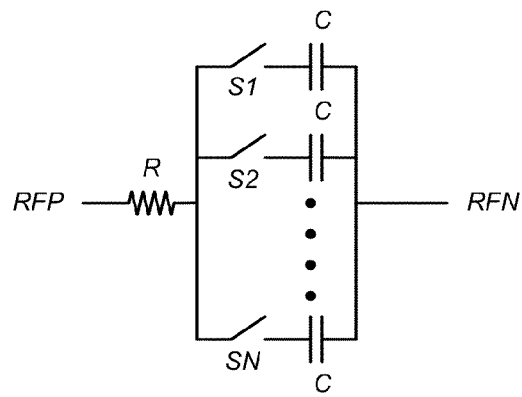
FIG. 6 illustrates an example resonant switching circuit according to an embodiment.

FIG. 6 illustrates an example resonant switching circuit according to an embodiment. In this example, the resonant switching circuit is an N-path switched capacitor circuit. N switches S1-SN are driven out of phase by a 1/N duty cycle. Each switch is coupled to a capacitor C. This example circuit can be modeled as an LRC where the DC peak impedance is shifted to the frequency of the switching signal. In example embodiments described in more detail below, in-phase signals (I+ and I−) and quadrature signals (Q+ and Q−) may be used to drive an N-path (N=4) because such signals provide a 25% duty cycle used in an N-path for N=4.

Figure 7:
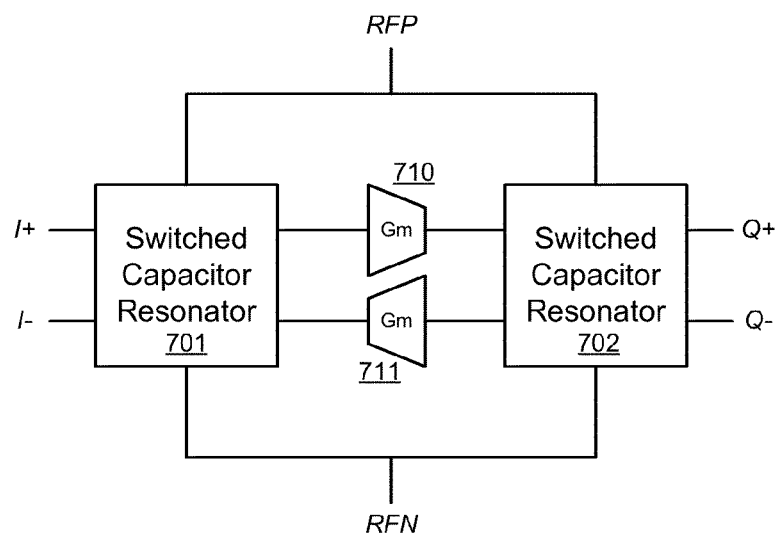
FIG. 7 illustrates an example resonant switching circuit according to another embodiment.

FIG. 7 illustrates an example resonant switching circuit according to another embodiment. Additional features and advantages of the present disclosure include resonant switching circuits implemented as complex filters. For example, in a complex filter, portions of an in-phase signal may be injected into a quadrature signal, and portions of a quadrature signal may be injected into the in-phase signal to achieve a frequency shift around the frequency of the switching drive signal (e.g., I+/− and Q+/− from a local oscillator). In this example, a resonant switching circuit includes a first switched capacitor resonator 701 that receives in-phase drive signals I+ and I−, a second switched capacitor resonator 702 that receives quadrature drive signals Q+ and Q−, and transconductance (gm) circuits 710 and 711 to couple portions of the I signals to the Q signals and couple portions of the Q signals to the I signals to shift the peak impedance of the resonant switching circuit. Switched capacitor resonators 701 and 702 may be double balanced switch capacitor circuits as described in more detail below. While two gm circuits are shown here, different numbers of gm circuits may be used in other implementations (e.g., 4 or more).

Figure 8:
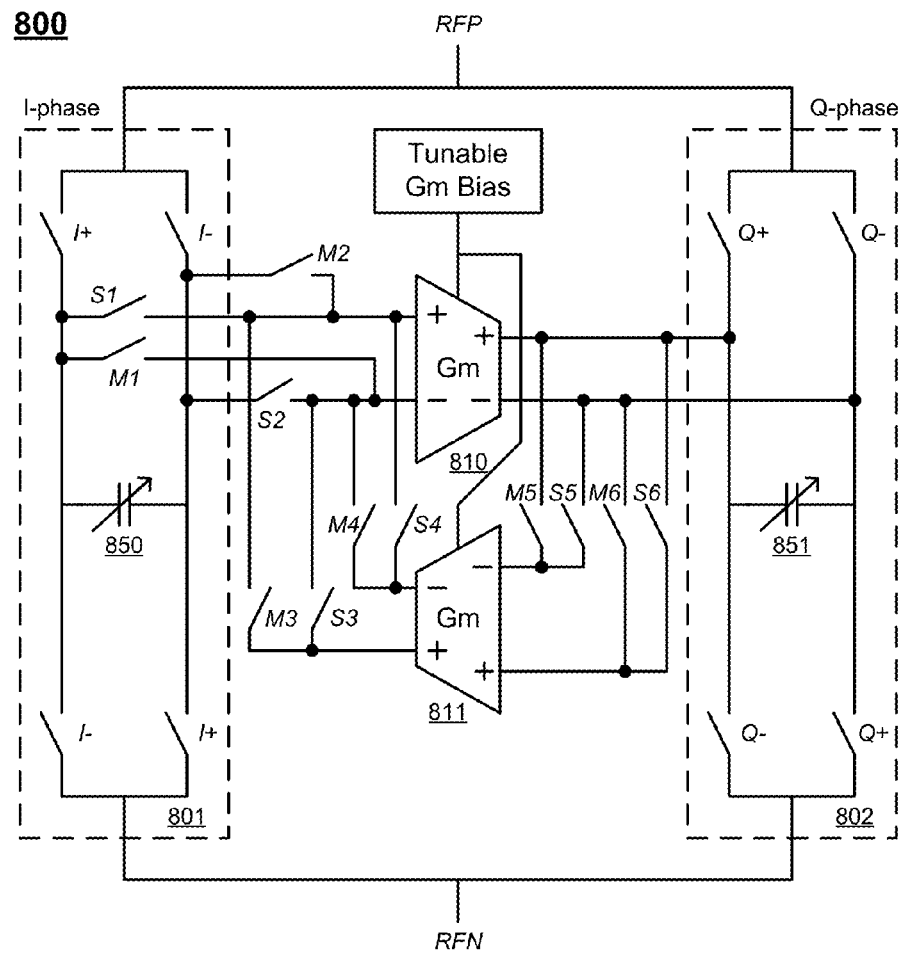
FIG. 8 illustrates a reconfigurable resonant switching circuit according to another embodiment.

FIG. 8 illustrates a reconfigurable resonant switching circuit according to another embodiment. Resonant switching circuit 800 includes a double balanced switched capacitor circuit 801 driven by in-phase I+ and I− signals, a double balanced switched capacitor circuit 802 driven by quadrature Q+ and Q− signals, a first transconductance circuit 810, and a second transconductance circuit 811. In this example, each double balanced switched capacitor circuit includes a capacitor—i.e., capacitors 850 and 851. A plurality of switches S1-S6 and M1-M6 selectively couple an input of the first transconductance circuit 810 to the in-phase switched capacitor circuit 801 and the output of the second transconductance circuit 811, and selectively couple the input of the second transconductance circuit 811 to the quadrature switched capacitor circuit 802 and the output of the first transconductance circuit 810. The result is a selective shift in a peak impedance above and below a drive frequency (e.g., the frequency of the I and Q signals).

Figure 9:
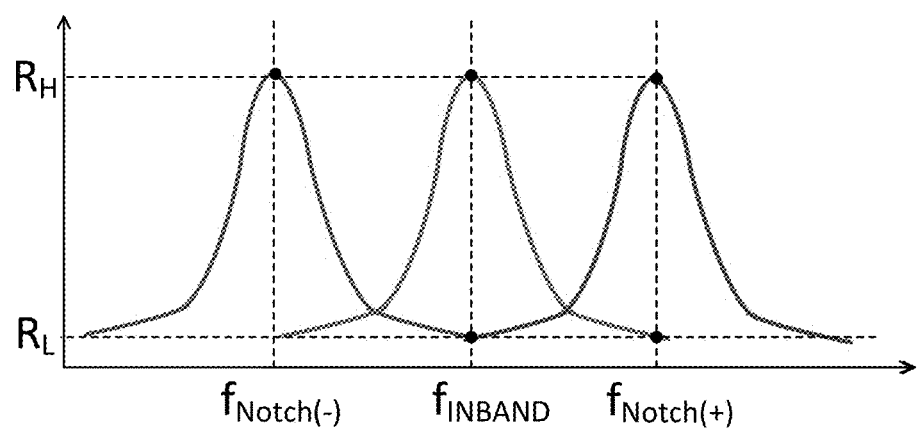
FIG. 9 illustrates a shift in peak impedance for a reconfigurable resonant switching circuit according to an embodiment.

FIG. 9 illustrates a shift in peak impedance for a reconfigurable resonant switching circuit according to an embodiment. When all switches S1-S6 and M1-M6 are open, a peak impedance across the terminals of circuit 800 occurs at the frequency of the drive signal (e.g., the frequency of the I and Q signals driving the double balanced switched capacitor circuits 801 and 802). This is shown in FIG. 9 as $F_{INBAND}$. When switches S1-S6 are closed and switches M1-M6 are open, the peak impedance is shifted up in frequency to a frequency denoted $F_{Notch(+)}$. Similarly, when switches S1-S6 are open and switches M1-M6 are closed, the peak impedance is shifted down in frequency to a frequency denoted $F_{Notch(-)}$. The frequency shifts of the peak impedance are given by the following formula:

$$fc = f_{LO} +/- Gm/[2\pi C_{DIFF}]$$

Where $f_{LO}$ is the drive frequency of the I and Q signals (e.g., $F_{INBAND}$), Gm is the gain of the transconductance circuits, and Cdiff is the capacitance of capacitors 850 and 851. As illustrated in FIG. 8, both capacitors 850 and 851 and transconductance (gm) circuits 810 and 811 may be adjustable to change the amount that the peak impedance is shifted in frequency when switches S1-S6 or M1-M6 are activated, for example. Accordingly, the system may sweep the peak impedance by adjusting the values of the capacitors or the bias on gm (to change the gain) until an undesirable signal is eliminated. A plurality of these resonant switching circuits as illustrated in FIGS. 2 and 4 may be used to attenuate an undesired frequency component. Reception of previously blocked information carried in an RF signal may indicate that an undesired signal, such as a jammer signal, may be have been successfully attenuated, for example.

Figure 10:
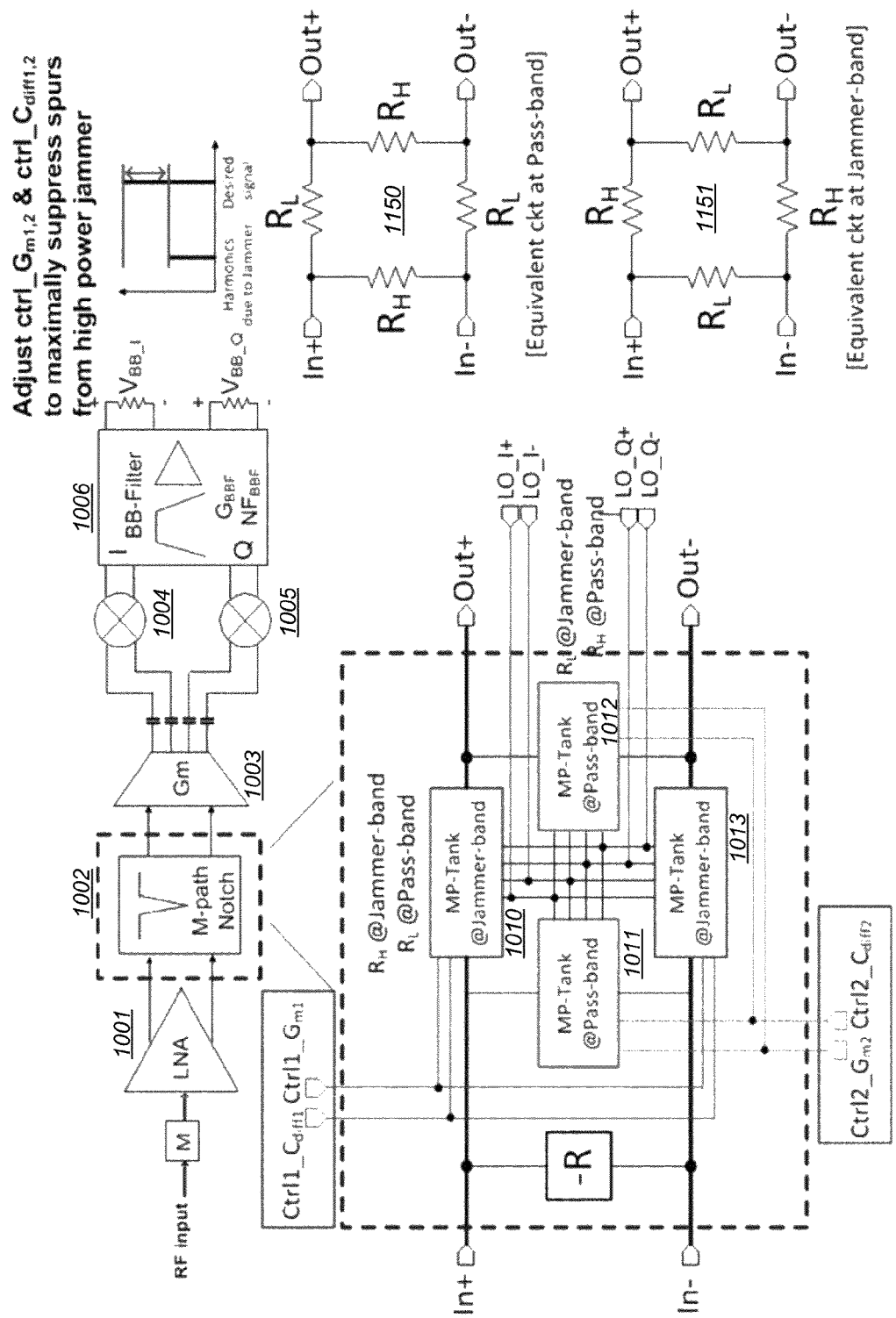
FIG. 10 illustrates a communications channel including a switching resonant filter according to another embodiment.

FIG. 10 illustrates a communications channel including a filter according to another embodiment. An RF signal is received at the input of an LNA 1001. Differential outputs of the LNA are coupled to differential inputs of an M-path notch filter 1002. Differential outputs of the M-path notch filter are coupled through a gain stage (Gm) 1003 to down converters 1004 and 1005. The down converters may also receive a local oscillator (LO) signal (not shown), which may include both I and Q components. Down converted signals are coupled to I and Q inputs of a baseband filter and gain stage 1006. The signals may be converted to digital signals and processed in a baseband processor, for example.

In this example, M-path notch filter 1002 comprises a four (4) element PI network of configurable M-path tank (MP-tank) circuits 1010, 1011, 1012, and 1013 that receive differential I and Q signals (I+, I−, Q+, and Q−). Control signals Ctrl1_Cdiff1 and Ctrl1_Gm1 are coupled to MP-tanks 1010 and 1013 to adjust the capacitor values and the gain of the transconductance circuits, respectively, to change the location, in frequency, of the peak impedance for MP-tanks 1010 and 1013. Similarly, control signals Ctrl2_Cdiff2 and Ctrl2_Gm2 are coupled to MP-tanks 1011 and 1012 to adjust the capacitor values and the gain of the transconductance circuits, respectively, to change the location, in frequency, of the peak impedance for MP-tanks 1011 and 1012. Accordingly, the peak impedance of each MP-tank may be configured to attenuate a jammer signal and pass a carrier signal, for example. The equivalent circuit for the pass band is shown at 1150. The equivalent circuit for the jammer band is shown at 1151.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
a first resonant switching circuit having a first terminal coupled to a first output terminal of a low noise amplifier to receive an RF signal;
a second resonant switching circuit having a first terminal coupled to the first output terminal of the low noise amplifier;
a third resonant switching circuit having a first terminal coupled to a second terminal of the first resonant switching circuit,
wherein the first resonant switching circuit is configured to produce a low impedance at a carrier frequency of the RF signal and a high impedance at a first frequency, wherein the second resonant switching circuit and the third resonant switching circuit are configured to produce a high impedance at the carrier frequency of the RF signal and a low impedance at the first frequency, wherein the first resonant switching circuit, the second resonant switching circuit, and the third resonant switching circuit are M-path circuits, wherein the M-path circuits comprise an in-phase switched capacitor circuit and a quadrature switched capacitor circuit, and wherein the in-phase switched capacitor circuit is selectively coupled to the quadrature switched capacitor circuit by a first transconductance circuit and the quadrature switched capacitor circuit is selectively coupled to the in-phase switched capacitor circuit by a second transconductance circuit.

2. The circuit of claim 1 wherein the first resonant switching circuit when driven at the first frequency is configured to produce said low impedance at said carrier frequency of the RF signal and said high impedance at said first frequency, and wherein when the second resonant switching circuit and the third resonant switching circuit are driven at the carrier frequency are configured to produce said high impedance at the carrier frequency of the RF signal and said low impedance at the first frequency.

3. The circuit of claim 2 wherein the first resonant switching circuit is coupled to a first local oscillator, and wherein the second resonant switching circuit and the third resonant switching circuit are coupled to a second local oscillator, wherein the first local oscillator and the second local oscillator are on a same integrated circuit.

4. The circuit of claim 1 wherein the first resonant switching circuit, the second resonant switching circuit, and the third resonant switching circuit are configured to be driven by four out of phase twenty-five (25) percent duty cycle signals.

5. The circuit of claim 4 wherein the first resonant switching circuit, the second resonant switching circuit, and the third resonant switching circuit are configured to be driven by a differential in-phase (I) signal and a differential quadrature (Q) signal.

6. The circuit of claim 1 wherein the low noise amplifier comprises a second output terminal coupled to a second terminal of the second resonant switching circuit, the circuit further comprising a fourth resonant switching circuit having a first terminal coupled to the second output terminal of the low noise amplifier and a second terminal coupled to a second terminal of the third resonant switching circuit.

7. The circuit of claim 6 wherein the first resonant switching circuit and the fourth resonant switching circuit are configured to be driven at the first frequency, and wherein the second resonant switching circuit and the third resonant switching circuit are configured to be driven at the carrier frequency.

8. The circuit of claim 1 wherein the first frequency is adjacent to the carrier frequency.

9. The circuit of claim 1 wherein the first frequency corresponds to a jammer signal.

10. The circuit of claim 9 wherein the first frequency corresponding to the jammer signal is generated by a local oscillator on a same circuit substrate.

11. The circuit of claim 1 wherein one or more of the resonant switching circuits comprise switched capacitor circuits.

12. The circuit of claim 11 wherein one or more of the resonant switching circuits further comprise transconductance (gm) circuits that are configured to selectively drive capacitors in the switched capacitor circuits to reconfigure a peak impedance to different frequencies.

13. The circuit of claim 1, one or more of the resonant switching circuits comprising:
a first double balanced switched capacitor circuit receiving differential in-phase signals;
a second double balanced switched capacitor circuit receiving differential quadrature signals;
a first transconductance circuit having an input and an output, wherein the output is coupled to the second double balanced switched capacitor circuit; and
a second transconductance circuit having an input and an output, wherein the output is coupled to the first double balanced switched capacitor circuit,
wherein the input of the first transconductance circuit is selectively coupled to the first double balanced switched capacitor circuit and the output of the second transconductance circuit, and the input of the second transconductance circuit is selectively coupled to the second double balanced switched capacitor circuit and the output of the first transconductance circuit to selectively shift a peak impedance above and below a drive frequency.

14. A method comprising:
receiving a signal on a first terminal of a first resonant switching circuit to produce a filtered signal on a second terminal of the first resonant circuit, the signal comprising a first frequency and a second frequency;
receiving the signal on a first terminal of a second resonant switching circuit; and
receiving the filtered signal on a first terminal of a third resonant switching circuit, wherein the first terminal of the third resonant switching circuit is coupled to the second terminal of the first resonant switching circuit, wherein the first resonant switching circuit is configured to produce a low impedance at the first frequency and a high impedance at the second frequency, wherein the second resonant switching circuit and the third resonant switching circuit are configured to produce a high impedance at the first frequency and a low impedance at the second frequency, wherein the first resonant switching circuit, the second resonant switching circuit, and the third resonant switching circuit are M-path circuits, wherein the M-path circuits comprise an in-phase switched capacitor circuit and a quadrature switched capacitor circuit, and wherein the in-phase switched capacitor circuit is selectively coupled to the quadrature switched capacitor circuit by a first transconductance circuit and the quadrature switched capacitor circuit is selectively coupled to the in-phase switched capacitor circuit by a second transconductance circuit.

15. The method of claim 14 wherein the signal is a differential signal, the method further comprising receiving a differential component of the signal on a second terminal of the second resonant switching circuit and on a first terminal of a fourth resonant switching circuit to produce a differential component of the filtered signal on a second terminal of the third resonant switching circuit and a second terminal of the fourth resonant switching circuit.

16. The method of claim 14 further comprising driving the first resonant switching circuit at the second frequency and driving the second resonant switching circuit and the third resonant switching circuit at the first frequency.

17. The method of claim 14 further comprising shifting a peak impedance of the first resonant switching circuit to the second frequency and shifting a peak impedance of the second resonant switching circuit and the third resonant switching circuit to the first frequency.

\* \* \* \* \*